US008731701B2

(12) United States Patent
Tsukinoki et al.

(10) Patent No.: US 8,731,701 B2
(45) Date of Patent: May 20, 2014

(54) SUBSTRATE TREATMENT METHOD AND SUBSTRATE TREATMENT SYSTEM

(75) Inventors: Wataru Tsukinoki, Koshi (JP); Yuichi Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1105 days.

(21) Appl. No.: 12/733,614

(22) PCT Filed: Aug. 21, 2008

(86) PCT No.: PCT/JP2008/064913
§ 371 (c)(1),
(2), (4) Date: Mar. 11, 2010

(87) PCT Pub. No.: WO2009/037941
PCT Pub. Date: Mar. 26, 2009

(65) Prior Publication Data
US 2010/0203434 A1    Aug. 12, 2010

(30) Foreign Application Priority Data

Sep. 20, 2007  (JP) ................ 2007-243457
Jun. 11, 2008  (JP) ................ 2008-153422

(51) Int. Cl.
| B65B 69/00 | (2006.01) |
| B65G 61/00 | (2006.01) |
| B65H 1/00 | (2006.01) |
| C23C 16/00 | (2006.01) |
| G03C 5/00 | (2006.01) |
| G06F 7/00 | (2006.01) |
| G06F 19/00 | (2011.01) |
| H01L 21/677 | (2006.01) |

(52) U.S. Cl.
USPC ........... 700/112; 700/113; 700/121; 700/213; 700/214; 700/217; 700/218; 118/719; 414/217; 414/416.01; 414/801; 414/806; 414/937; 414/940; 414/941; 430/30

(58) Field of Classification Search
USPC ......... 700/112, 121, 213, 214, 218, 113, 217; 118/719; 414/217, 416.01, 801, 806, 414/937, 940, 941; 430/30
See application file for complete search history.

(56) References Cited

U.S. PATENT DOCUMENTS 6,315,512 B1 * 11/2001 Tabrizi et al. ................ 414/217
7,323,060 B2 * 1/2008 Yamada et al. ............... 118/500
(Continued)

FOREIGN PATENT DOCUMENTS

JP    2002-260995 A    9/2002
JP    2003-37148 A     2/2003
(Continued)

OTHER PUBLICATIONS

International Search Report of the International Searching Authority mailed on Nov. 25, 2008 for the corresponding international patent application No. PCT/JP2008/064913 (English translation enclosed).

*Primary Examiner* — Mohammad Ali
*Assistant Examiner* — Jennifer L Norton
(74) *Attorney, Agent, or Firm* — Posz Law Group, PLC

(57) ABSTRACT

After a cassette is mounted on a cassette mounting part, a control unit instructs a substrate treatment apparatus to start treatment on substrates in the cassette. Thereafter, the control unit indicates, to the substrate treatment apparatus, a cassette on the cassette mounting part to which a substrate is transferred at completion of the treatment. If the transfer destination cassette for the substrate at the completion of treatment has not been indicated when a number of remaining treatment steps for the substrate reaches a predetermined set number, an alarm is given from the substrate treatment apparatus. This alarm is sent from the substrate treatment apparatus to the control unit, and the control unit indicates a transfer destination cassette for the substrate.

22 Claims, 14 Drawing Sheets

(56) References Cited

U.S. PATENT DOCUMENTS

| | | | |
|---|---|---|---|
| 7,549,811 B2* | 6/2009 | Yamada et al. | 396/611 |
| 7,618,203 B2* | 11/2009 | Fujimaru et al. | 396/611 |
| 7,899,568 B2* | 3/2011 | Yamamoto | 700/112 |
| 8,043,039 B2* | 10/2011 | Yamamoto et al. | 414/217 |
| 8,206,076 B2* | 6/2012 | Ueda et al. | 414/217 |
| 8,560,108 B2* | 10/2013 | Matsuyama et al. | 700/112 |
| 2001/0037585 A1* | 11/2001 | Kato et al. | 34/406 |
| 2011/0144792 A1* | 6/2011 | Nakata et al. | 700/112 |
| 2013/0032179 A1* | 2/2013 | Kaneko | 134/133 |
| 2013/0272823 A1* | 10/2013 | Hudgens et al. | 414/217 |

FOREIGN PATENT DOCUMENTS

| | | |
|---|---|---|
| JP | 2004-87795 A | 3/2004 |
| JP | 2004-214350 A | 7/2004 |

\* cited by examiner

SUBSTRATE TREATMENT METHOD AND SUBSTRATE TREATMENT SYSTEM

CROSS REFERENCE TO RELATED APPLICATIONS

This application is a U.S. national stage application of PCT/JP2008/064913 filed on Aug. 21, 2008, and claims priority to, and incorporates by reference, Japanese Patent Application Nos. 2007-243457 filed on Sep. 20, 2007 and 2008-153422 filed on Jun. 11, 2008.

TECHNICAL FIELD

The present invention relates to a substrate treatment method and a substrate treatment system each performing treatment on a substrate.

For example, in a photolithography process in a manufacturing process of a semiconductor device, for example, a series of treatments such as a resist coating treatment of applying a resist solution onto a wafer to form a resist film, exposure processing of exposing the resist film into a predetermined pattern, and a developing treatment of developing the exposed resist film, are sequentially performed to form a predetermined resist pattern on the wafer. The series of treatments are performed in a coating and developing treatment apparatus incorporating various treatment units treating the wafer and transfer apparatuses transferring the wafer.

For example, as shown in FIG. 16, a coating and developing treatment apparatus 200 integrally includes a cassette station 201 for transferring a cassette C in/out generally from/to the outside, a treatment station 202 in which a plurality of treatment units performing various treatments such as the resist coating treatment, the developing treatment, thermal treatment and so on are provided, and an interface station 203 delivering wafers between an adjacent aligner A and the treatment station 202.

In the cassette station 201, a plurality of cassette mounting plates 210 on which cassettes C transferred in from the outside are mounted, and a wafer transfer apparatus 211 transferring the wafer between the cassette C on the cassette mounting plate 210 and the treatment station 202, are provided (see Patent Document 1).

When the wafer treatment is performed in the above-described coating and developing treatment apparatus 200, a cassette C housing a plurality of wafers in one lot is first mounted on a predetermined cassette mounting plate 210. Then, the wafers in the cassette C are transferred in order by the wafer transfer apparatus 211 to the treatment station 202 and the aligner A and subjected to treatment. The wafers through the treatment are returned by the wafer transfer apparatus 211 from the treatment station 202 to the cassette C on the cassette mounting plate 210.

Incidentally, in a plant manufacturing the semiconductor device, a plurality of coating and developing treatment apparatuses 200 and other treatment apparatuses required for the manufacturing process of the semiconductor device are generally installed. Further, a main control unit 300 collectively managing a manufacturing line of the semiconductor device in the plant by giving an instruction to the plurality of treatment units is provided in the plant. The main control unit 300 conventionally manages the treatment on each wafer and each lot by associating and fixing the cassette used in transfer between the treatment apparatuses with the wafers in one lot therein, using IDs or the like.

Also in the above-described coating and developing treatment apparatus 200, the cassette is associated with the wafers in one lot therein. Therefore, in treatment, after the wafers are transferred out of each cassette on the cassette mounting plate 210, the cassette is kept waiting on the cassette mounting plate 210, and the wafers through the treatment are returned to the same cassette.

PATENT DOCUMENT

Japanese Patent Application Publication No. 2006-54438

DISCLOSURE OF THE INVENTION

Problems to be Solved by the Invention

However, in recent years, the coating and developing treatment apparatus is required to deal with a so-called small-lot treatment according to large item small scale production of semiconductor devices. In the case of small-lot treatment, the number of wafers housed in one cassette is smaller, so that once the wafer treatment is started, the wafers in the cassette on the cassette mounting plate are taken out in a short time and a small quantity of wafers will be treated in the treatment station. For this reason, when the cassette is kept waiting on the cassette mounting plate until the treatment for the wafers is completed as described above, a new cassette cannot be mounted on the cassette mounting plate, and new wafers cannot be transferred into the treatment station even though there is a vacancy for the wafer treatment in the treatment station. As a result, the throughput of the wafer treatment in the coating and developing treatment apparatus will decrease.

To solve the problem, it can be proposed to stop associating the cassette with the wafers therein and return the wafers after completion of the treatment to an arbitrary cassette. In this case, the wafers through the treatment can be transferred sequentially to a cassette having vacancy at that time, so that the waiting time of each cassette for wafer treatment is reduced and the cassettes can be efficiently changed.

However, in this case, a cassette being a transfer destination, for example, for wafers transferred out of a cassette is not determined yet at that time. Therefore, the coating and developing treatment apparatus needs to determine the transfer destination cassette for the wafers under indication from the main control unit during the wafer treatment. If the indication is greatly delayed, the treatment on the wafers will stagnate. Further, if trouble or the like has occurred in the coating and developing treatment apparatus, there arise problems. One problem is that to which cassette the wafers are transferred after the trouble is solved. In the wafer treatment method in which the transfer destination cassette for the wafers is selected afterwards, the wafer treatment cannot be smoothly performed in some cases unless the concrete management of the wafer treatment in the coating and developing treatment apparatus is changed.

The present invention has been made in consideration of the above viewpoints, and an object thereof is to provide a substrate treatment method and a substrate treatment system each smoothly performing treatment on a substrate in a substrate treatment apparatus such as a coating and developing treatment apparatus in the case where a cassette to which the substrate is returned at completion of the treatment can be arbitrarily selected.

Means for Solving the Problems

The present invention to achieve the above object is a substrate treatment method performed using a substrate treatment apparatus operating based on an instruction of a control unit, the substrate treatment apparatus including: a plurality of cassette mounting parts mounting cassettes thereon when transferring in/out the cassettes from/to an outside of the substrate treatment apparatus, each of the cassettes housing a plurality of substrates; a substrate treatment part performing a series of treatment composed of a plurality of treatment steps on a substrate; and a substrate transfer part transferring the substrate in the cassette on the cassette mounting part to the substrate treatment part and transferring a substrate through the treatment in the substrate treatment part to the cassette on the cassette mounting part, and the control unit having a function of arbitrarily selecting a cassette to which the substrate through the treatment is transferred, from among the cassettes mounted on the plurality of cassette mounting parts and indicating the cassette being a transfer destination to the substrate treatment apparatus, the substrate treatment method including the steps of: the control unit instructing the substrate treatment apparatus to start treatment on substrates in a cassette transferred into the cassette mounting part; and thereafter, the control unit indicating, to the substrate treatment apparatus, a cassette on the cassette mounting part to which the substrate started to be treated is transferred at completion of the treatment, wherein if the transfer destination cassette for the substrate at the completion of treatment has not been indicated when a number of remaining treatment steps for the substrate reaches a predetermined set number, an alarm is given from the substrate treatment apparatus.

According to the present invention, since the transfer destination cassette can be arbitrarily selected from among the cassettes on the plurality of cassette mounting parts after start of treatment, the substrate can be transferred to a cassette having vacancy at the completion of treatment. Therefore, it is unnecessary to keep the cassette waiting on the cassette mounting part until the substrate is returned as in the prior art, so that the efficiency of treatment can be improved even in small-lot treatment having small number of substrates in a lot. Further, if the transfer destination cassette for the substrate at the completion of treatment has not been indicated when a number of remaining treatment steps for the substrate reaches a predetermined set number, an alarm is given from the substrate treatment apparatus, so that, for example, the workers in the plant and the control unit can immediately deal with the situation. Accordingly, the substrate treatment can be smoothly performed even when the transfer destination cassette is arbitrarily selected after start of treatment.

The alarm from the substrate treatment apparatus may be sent to the control unit.

The control unit may indicate, on a priority basis, a transfer destination cassette for the substrate for which the transfer destination cassette has not been determined, based on the alarm from the substrate treatment apparatus.

The step of indicating a cassette on the cassette mounting part may be performed when the number of remaining treatment steps for the substrate reaches another set number larger than the set number.

In the above-described substrate treatment method, if trouble occurs in the substrate treatment apparatus while a plurality of substrates in one lot are being transferred out of the cassette on the cassette mounting part, all of the substrates in the one lot may be transferred to the substrate treatment part, and transferred to the indicated cassette on the cassette mounting part passing through a transfer path at normal time without being subjected to treatment.

In the above-described substrate treatment method, if trouble occurs in the substrate treatment apparatus while a plurality of substrates in one lot are being transferred out of the cassette on the cassette mounting part, a substrate which has been already transferred out among the substrates in the one lot may be returned to an original cassette on the cassette mounting part.

In the above-described substrate treatment method, if trouble has occurred in the substrate treatment apparatus while a substrate is being treated in the substrate treatment part and when the transfer destination cassette for the substrate is not mounted on the cassette mounting part at a time when the trouble is solved, another alarm may be given from the substrate treatment apparatus.

The another alarm from the substrate treatment apparatus may be sent from the substrate treatment apparatus to the control unit, and the control unit may transfer, from the outside of the substrate treatment apparatus into the cassette mounting part, a cassette capable of housing all of substrates in a lot to which the substrate belongs.

The above-described substrate treatment method may further include the step of: temporarily transferring, to the outside of the substrate treatment apparatus, a cassette which has become vacant due to transfer of the substrates from the cassette mounting part to the substrate treatment part, wherein if an estimated time from a time when the cassette has become vacant till when the substrates through the treatment are started to be transferred into the cassette is shorter than a predetermined set time, the transfer of the vacant cassette to the outside may be stopped.

In the step of indicating a cassette on the cassette mounting part, a plurality of cassettes may be indicated such that a plurality of substrates in one lot are transferred to different cassettes. Further, the plurality of cassettes may include a cassette to which one substrate of the plurality of substrates in the one lot is transferred and another cassette to which remaining substrates are transferred.

In the step of indicating a cassette on the cassette mounting part, one cassette to which substrates in a plurality of lots are transferred may be indicated.

If after the step of indicating a cassette on the cassette mounting part, the indicated cassette is not mounted on the cassette mounting part, the control unit may indicate a cassette different from the indicated cassette, as a transfer destination for the substrate.

The cassette may have a plurality of substrate housing slots, and in the step of indicating a cassette on the cassette mounting part, a substrate housing slot being a transfer destination for the substrate may be further indicated.

The invention according to another aspect is a substrate treatment system causing a substrate treatment apparatus to operate based on an instruction of a control unit to perform substrate treatment, the substrate treatment apparatus including: a plurality of cassette mounting parts mounting cassettes thereon when transferring in/out the cassettes from/to an outside of the substrate treatment apparatus, each of the cassettes housing a plurality of substrates; a substrate treatment part performing a series of treatment composed of a plurality of treatment steps on a substrate; and a substrate transfer part transferring the substrate in the cassette on the cassette mounting part to the substrate treatment part and transferring a substrate through the treatment in the substrate treatment part to the cassette on the cassette mounting part, and the control unit having a function of arbitrarily selecting a cassette to which the substrate through the treatment is transferred, from among the cassettes mounted on the plurality of cassette mounting parts and indicating the cassette being a transfer destination to the substrate treatment apparatus, wherein the control unit instructs the substrate treatment apparatus to start treatment on substrates in a cassette transferred into the cassette mounting part, thereafter, the control unit indicates, to the substrate treatment apparatus, a cassette on the cassette mounting part to which the substrate started to be treated is transferred at completion of the treatment, and if the transfer destination cassette for the substrate at the completion of treatment has not been indicated when a number of remaining treatment steps for the substrate reaches a predetermined set number, an alarm is given from the substrate treatment apparatus.

The alarm from the substrate treatment apparatus may be sent to the control unit.

The control unit may indicate, on a priority basis, a transfer destination cassette for the substrate for which the transfer destination cassette has not been determined, based on the alarm from the substrate treatment apparatus.

The indication of a cassette on the cassette mounting part may be performed when the number of remaining treatment steps for the substrate reaches another set number larger than the set number.

In the above-described substrate treatment system, if trouble occurs in the substrate treatment apparatus while a plurality of substrates in one lot are being transferred out of the cassette on the cassette mounting part, all of the substrates in the one lot may be transferred to the substrate treatment part after the trouble is solved, and transferred to the indicated cassette on the cassette mounting part passing through a transfer path at normal time, in which substrates existing in the cassette at occurrence of the trouble of the substrates in the one lot may be transferred to the indicated cassette on the cassette mounting part without being subjected to treatment in the substrate treatment part.

In the above-described substrate treatment system, if trouble occurs in the substrate treatment apparatus while a plurality of substrates in one lot are being transferred out of the cassette on the cassette mounting part, a substrate which has been already transferred out among the substrates in the one lot may be returned to an original cassette on the cassette mounting part after the trouble is solved.

In the above-described substrate treatment system, if trouble has occurred in the substrate treatment apparatus while a substrate is being treated in the substrate treatment part and when the cassette is not mounted on the cassette mounting part being a transfer destination for the substrate at a time when the trouble is solved, another alarm may be given from the substrate treatment apparatus.

The another alarm from the substrate treatment apparatus may be sent from the substrate treatment apparatus to the control unit, and the control unit may transfer, from the outside of the substrate treatment apparatus into the cassette mounting part, a cassette capable of housing all of substrates in a lot to which the substrate belongs.

In the above-described substrate treatment system, a cassette which has become vacant due to transfer of the substrates from the cassette mounting part to the substrate treatment part may be temporarily transferred to the outside of the substrate treatment apparatus, and if an estimated time from a time when the cassette has become vacant till when the substrates through the treatment are started to be transferred into the cassette is shorter than a predetermined set time, the transfer of the vacant cassette to the outside may be stopped.

When a cassette on said cassette mounting part is indicated, a plurality of cassettes may be indicated such that a plurality of substrates in one lot are transferred to different cassettes. Further, the plurality of cassettes may include a cassette to which one substrate of the plurality of substrates in the one lot is transferred and another cassette to which remaining substrates are transferred.

When a cassette on said cassette mounting part is indicated, one cassette to which substrates in a plurality of lots are transferred may be indicated.

If after the indication of a cassette on the cassette mounting part, the indicated cassette is not mounted on the cassette mounting part, the control unit may indicate a cassette different from the indicated cassette, as a transfer destination for the substrate.

The cassette may have a plurality of substrate housing slots, and when a cassette on said cassette mounting part is indicated, a substrate housing slot being a transfer destination for the substrate may be further indicated.

Effect of the Invention

According to the present invention, a substrate treatment dealing with small-lot treatment can be smoothly performed.

BRIEF DESCRIPTION OF THE DRAWINGS

FIG. 6 is an explanatory view showing an example of a case where wafers are transferred to a cassette different from the cassette at transfer-in.

Figure 1:
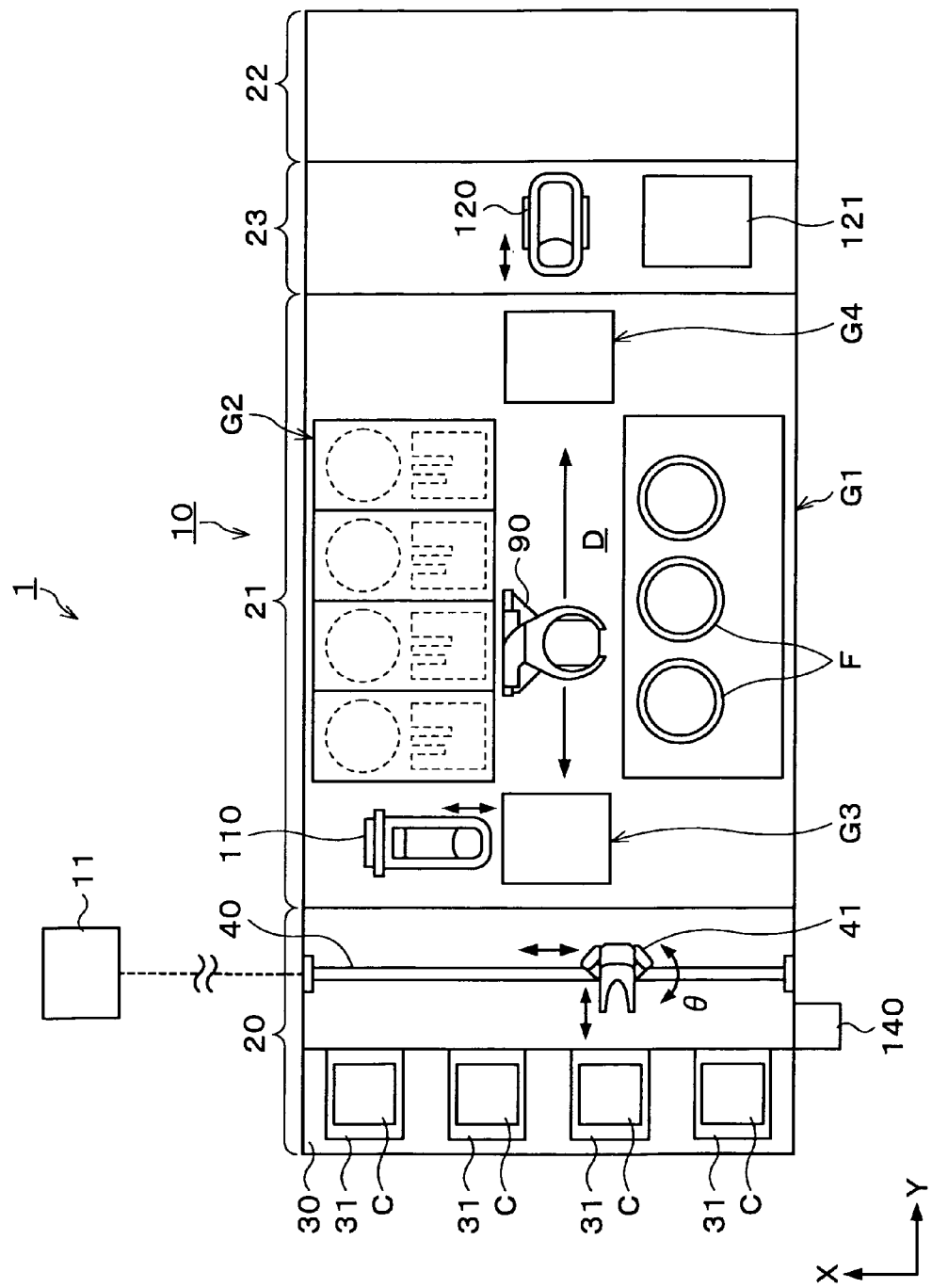
FIG. 1 is an explanatory view showing the outline of a structure of a substrate treatment system.

EXPLANATION OF CODES 1 substrate treatment system
10 coating and developing treatment apparatus
11 control unit
20 cassette station 21 treatment station
31 cassette mounting plate
41 wafer transfer apparatus
C cassette
W wafer

BEST MODE FOR CARRYING OUT THE INVENTION

Hereinafter, embodiments of the present invention will be described. FIG. 1 is an explanatory view showing the outline of a structure of a substrate treatment system 1 according to the present invention.

The substrate treatment system 1 includes a coating and developing treatment apparatus 10 as a substrate treatment apparatus, for example, installed in a plant, and a control unit 11.

The coating and developing treatment apparatus 10 has, as shown in FIG. 1, a structure in which, for example, a cassette station 20 into/from which cassettes C are transferred from/to the outside; a treatment station 21, as a substrate treatment part, including a plurality of various kinds of treatment units each performing predetermined treatment in a manner of single-wafer treatment in photolithography treatment; and an interface station 23 delivering a wafer W to/from an aligner 22 adjacent to the treatment station 21, are integrally connected.

In the cassette station 20, a cassette mounting table 30 is provided. On the cassette mounting table 30, a plurality of, for example, four cassette mounting plates 31, as cassette mounting parts, are provided. The cassette mounting plates 31 are provided side by side in one line in a horizontal X-direction (a top-to-bottom direction in FIG. 1). On the cassette mounting plates 31, cassettes can be mounted when the cassettes are transferred-in/out from/to the outside of the coating and developing treatment apparatus 10. Note that the transfer-in/out of the cassette between the coating and developing treatment apparatus 10 and the outside thereof is performed by an external cassette transfer apparatus B shown in FIG. 2 transferring the cassette between treatment apparatuses in the plant.

In the cassette station 20, a wafer transfer apparatus 41 is provided, as a substrate transfer part which is movable on a transfer path 40 extending in the X-direction as shown in FIG. 1. The wafer transfer apparatus 41 is also movable in the vertical direction and around the vertical axis (in a θ-direction), and can transfer the wafer W between the cassette C on each of the cassette mounting plates 31 and a delivery unit in a later-described third block G3 in the treatment station 21.

In the treatment station 21, a plurality of, for example, four blocks G1, G2, G3 and G4 each including various units are provided. For example, the first block G1 is provided on the front side (the negative direction side in the X-direction in FIG. 1) in the treatment station 21, and the second block G2 is provided on the back side (the positive direction side in the X-direction in FIG. 1) in the treatment station 21. Further, the third block G3 is provided on the cassette station 20 side (the negative direction side in a Y-direction in FIG. 1) in the treatment station 21, and the fourth block G4 is provided on the interface station 23 side (the positive direction side in the Y-direction in FIG. 1) in the treatment station 21.

Figure 3:
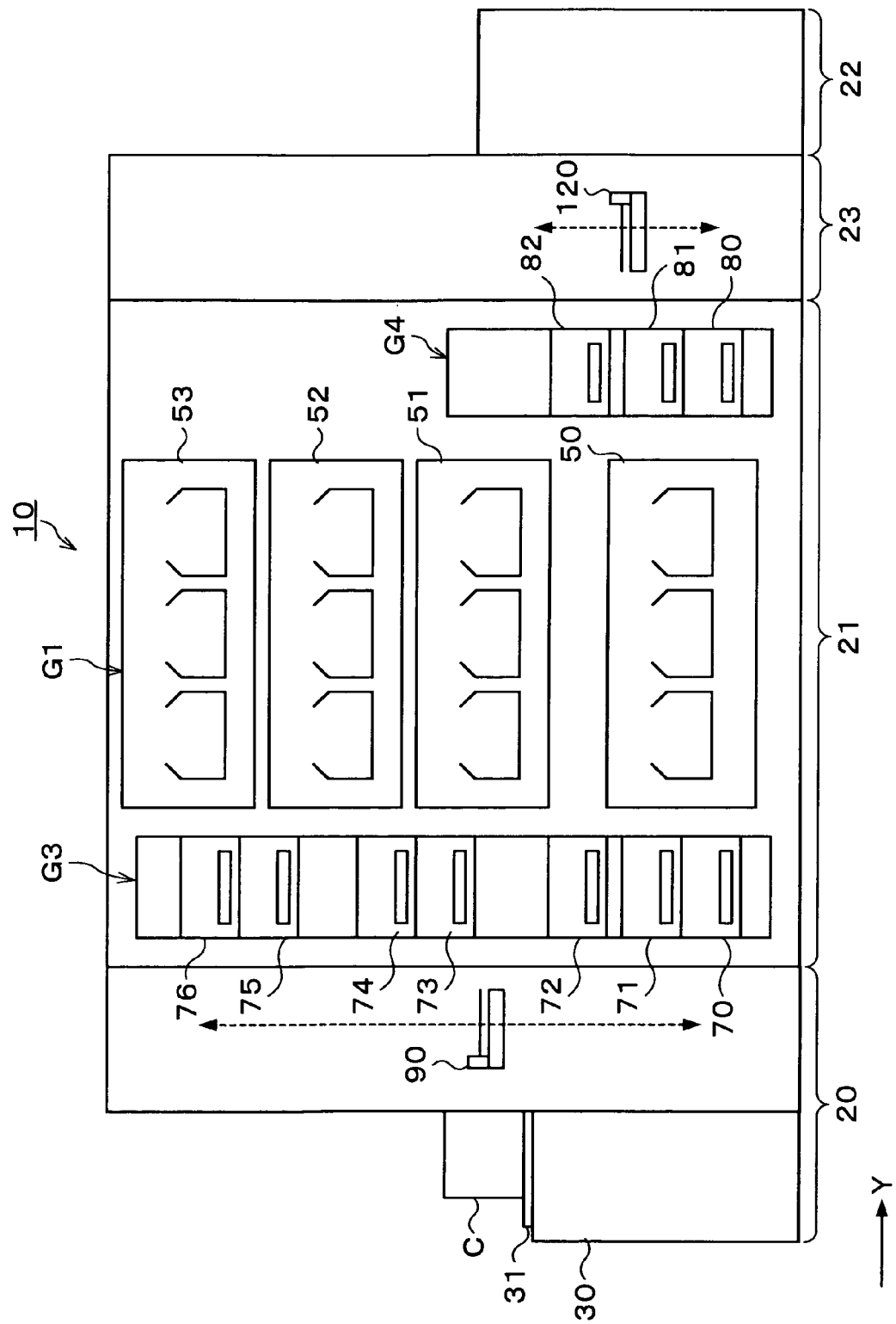
FIG. 3 is a side view showing the outline of the inner structure of the coating and developing treatment apparatus.

For example, in the first block G1, a plurality of solution treatment units, for example, a developing treatment unit 50 performing developing treatment on the wafer W, a lower anti-reflection film forming unit 51 forming an anti-reflection film at a layer under a resist film on the wafer W (hereinafter, referred to as a "lower anti-reflection film"), a resist coating unit 52 applying a resist solution to the wafer W to form a resist film, and an upper anti-reflection film forming unit 53 forming an anti-reflection film at a layer on the resist film on the wafer W (hereinafter, referred to as an "upper anti-reflection film"), are four-tiered in order from the bottom as shown in FIG. 3.

For example, each of the units 50 to 53 in the first block G1 has a plurality of cups F each housing the wafer W in treatment, in the horizontal direction, and can treat a plurality of wafers W in parallel.

Figure 2:
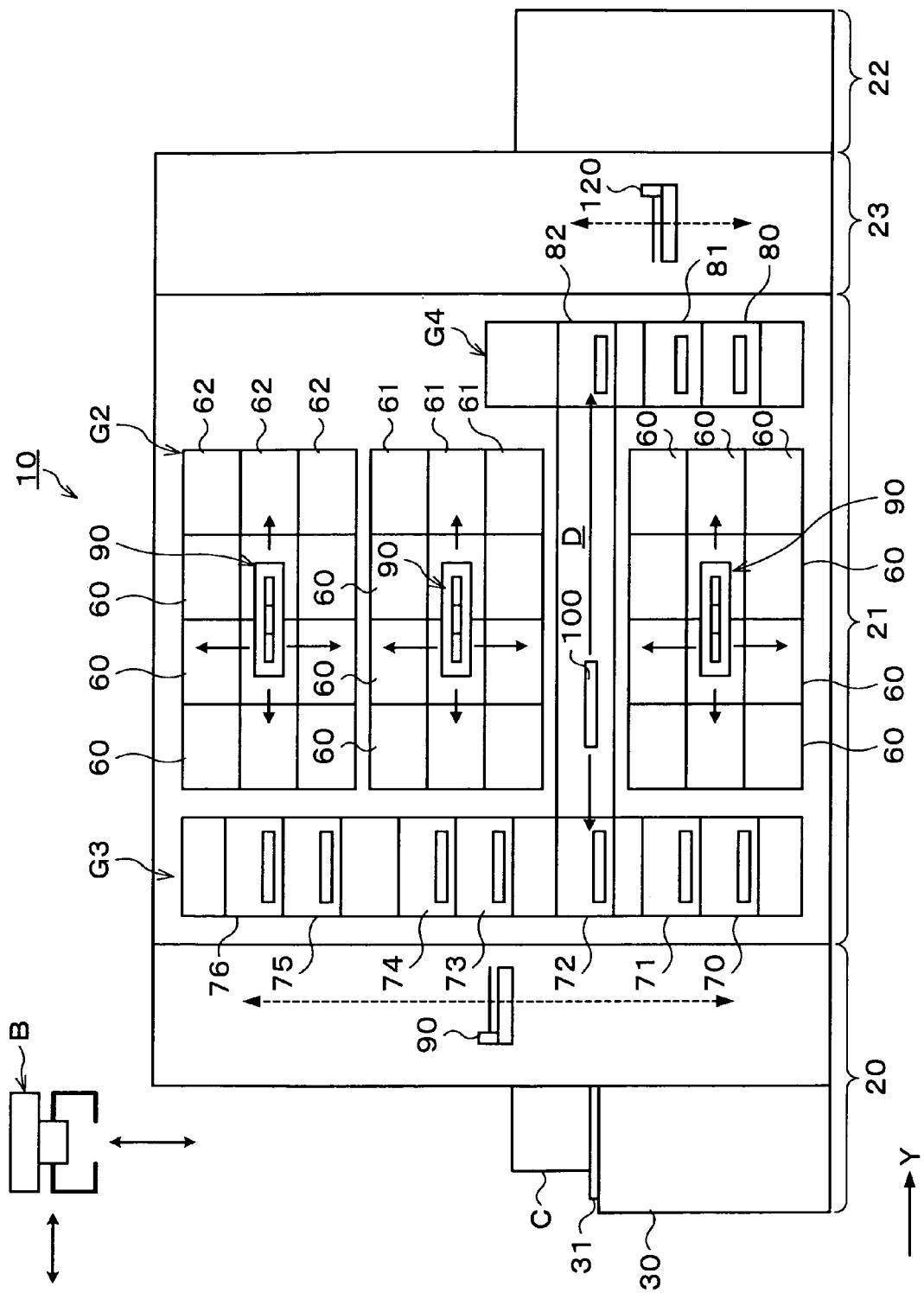
FIG. 2 is a side view showing the outline of an inner structure of a coating and developing treatment apparatus.

For example, in the second block G2, thermal treatment units 60 each performing thermal treatment on the wafer W, adhesion units 61 each performing hydrophobic treatment on the wafer W, and edge exposure units 62 each exposing an outer peripheral portion of the wafer W to light, are provided one on top of the other in the vertical direction and side by side in the horizontal direction as shown in FIG. 2. The thermal treatment unit 60 has a thermal plate mounting and heating the wafer W thereon and a cooling plate mounting and cooling the wafer W thereon, and thus can perform both heating treatment and cooling treatment. Note that the numbers and arrangement of the thermal treatment units 60, the adhesion units 61, and the edge exposure units 62 can be arbitrarily selected.

For example, in the third block G3, a plurality of delivery units 70, 71, 72, 73, 74, 75, and 76 are provided in order from the bottom. Further, in the fourth block G4, a plurality of delivery units 80, 81, and 82 are provided in order from the bottom.

In a region surrounded by the first block G1 to the fourth block G4, a wafer transfer region D is formed as shown in FIG. 1. In the wafer transfer region D, for example, a wafer transfer apparatus 90 is disposed.

The wafer transfer apparatus 90 has a transfer arm movable, for example, in the Y-direction, a forward and backward direction, the θ-direction, and an upward and downward direction. The wafer transfer apparatus 90 can move within the wafer transfer region D and transfer the wafer W to a predetermined unit in the first block G1, the second block G2, the third block G3, and the fourth block G4 around the wafer transfer region D.

A plurality of wafer transfer apparatuses 90 are vertically arranged, for example, as shown in FIG. 2, and can transfer the wafers W, for example, to predetermined units at the similar heights in the blocks G1 to G4.

Further, a shuttle transfer apparatus 100 linearly transferring the wafer W between the third block G3 and the fourth block G4 is provided in the wafer transfer region D.

The shuttle transfer apparatus 100 is linearly movable, for example, in the Y-direction. The shuttle transfer apparatus 100 can move in the Y-direction while supporting the wafer W thereon to transfer the wafer W between the delivery unit 72 in the third block G3 and the delivery unit 82 in the fourth block G4.

As shown in FIG. 1, a wafer transfer apparatus 110 is provided adjacent to the positive direction side in the X-direction of the third block G3. The wafer transfer apparatus 110 has a transfer arm movable, for example, in the forward and backward direction, the θ-direction, and the upward and downward direction. The transfer apparatus 110 can vertically move while supporting the wafer W thereon to transfer the wafer W to each of the delivery units in the third block G3.

In the interface station 23, a wafer transfer apparatus 120 and a delivery unit 121 are provided. The wafer transfer apparatus 120 has a transfer arm movable, for example, in the forward and backward direction, the θ-direction, and the upward and downward direction. The wafer transfer apparatus 120 can support the wafer W, for example, on the transfer arm and transfer the wafer W to each of the delivery units in the fourth block G4 and the delivery unit 121.

Figure 4:
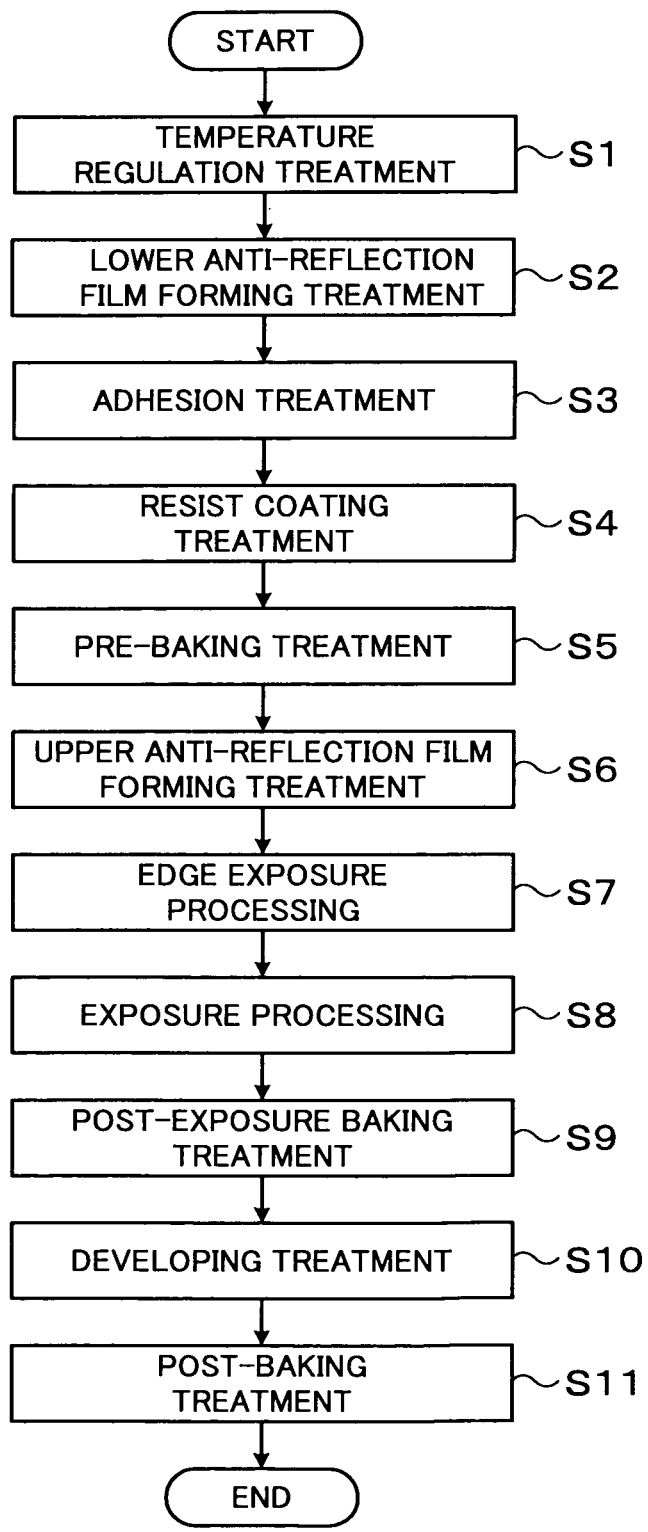
FIG. 4 is a flowchart showing main steps of wafer treatment performed in the coating and developing treatment apparatus.

In the coating and developing treatment apparatus 10 structured as described above, for example, the following wafer treatment is performed. FIG. 4 is a flowchart showing an example of main steps of the wafer treatment.

First, a cassette C housing a plurality of wafers W in one lot is mounted by the external cassette transfer apparatus B on a predetermined cassette mounting plate 31 in the cassette station 20 shown in FIG. 1. Then, the wafers W in the cassette C are taken out in order by the wafer transfer apparatus 41 and transferred, for example, to the delivery unit 73 in the third block G3 of the treatment station 21.

Subsequently, the wafer W is transferred by the wafer transfer apparatus 90 to the thermal treatment unit 60 in the second block G2 and subjected to temperature regulation (Step S1 in FIG. 4). Thereafter, the wafer W is transferred by the wafer transfer apparatus 90, for example, to the lower anti-reflection film forming apparatus 51 in the first block G1, and a lower anti-reflection film is formed on the wafer W (Step S2 in FIG. 4). Then, the wafer W is transferred to the thermal treatment unit 60 in the second block G2 and heated and temperature-regulated. Thereafter, the wafer W is returned to the delivery unit 73 in the third block G3.

The wafer W is then transferred by the wafer transfer apparatus 110 to the delivery unit 74 in the same third block G3. Thereafter, the wafer W is transferred by the wafer transfer apparatus 90 to the adhesion unit 61 in the second block G2 and subjected to adhesion treatment (Step S3 in FIG. 4). Thereafter, the wafer W is transferred by the wafer transfer apparatus 90 to the resist coating unit 52, and a resist film is formed on the wafer W (Step S4 in FIG. 4). Thereafter, the wafer W is transferred by the wafer transfer apparatus 90 to the thermal treatment unit 60 and subjected to pre-baking treatment (Step S5 in FIG. 4). Thereafter, the wafer W is transferred by the wafer transfer apparatus 90 to the delivery unit 75 in the third block G3.

Then, the wafer W is transferred by the wafer transfer apparatus 90 to the upper anti-reflection film forming unit 53, and an upper anti-reflection film is formed on the wafer W (Step S6 in FIG. 4). Thereafter, the wafer W is transferred by the wafer transfer apparatus 90 to the thermal treatment unit 60, and heated and temperature-regulated. Thereafter, the wafer W is transferred to the edge exposure unit 62 and subjected to edge exposure processing (Step S7 in FIG. 4).

Thereafter, the wafer W is transferred by the wafer transfer apparatus 90 to the delivery unit 76 in the third block G3.

Then, the wafer W is transferred by the wafer transfer apparatus 110 to the delivery unit 72, and transferred by the shuttle transfer apparatus 100 to the delivery unit 82 in the fourth block G4. Thereafter, the wafer W is transferred by the wafer transfer apparatus 120 in the interface station 23 to the aligner 22 and subjected to exposure processing (Step S8 in FIG. 4).

Then, the wafer W is transferred by the wafer transfer apparatus 120 to the delivery unit 80 in the fourth block G4. Thereafter, the wafer W is transferred by the wafer transfer apparatus 90 to the thermal treatment unit 60 and subjected to post-exposure baking treatment (Step S9 in FIG. 4). Thereafter, the wafer W is transferred by the wafer transfer apparatus 90 to the developing treatment unit 50 and developed (Step S10 in FIG. 4). After completion of the development, the wafer W is transferred by the wafer transfer apparatus 90 to the thermal treatment unit 60 and subjected to post-baking treatment (Step S11 in FIG. 4).

Thereafter, the wafer W is transferred by the wafer transfer apparatus 90 to the delivery unit 70 in the third block G3, and then transferred by the wafer transfer apparatus 41 in the cassette station 20 into the cassette C on the predetermined cassette mounting plate 31. Thus, a series of photolithography process is completed.

The control of the operation and so on of the coating and developing treatment apparatus 10 is conducted using, for example, the control unit 11. The control unit 11 is composed of a computer including, for example, a CPU, a memory and so on. The control unit 11 outputs an instruction signal to the coating and developing treatment apparatus 10, for example, based on a device manufacturing management recipe of the plant, so that the coating and developing treatment apparatus 10 can drive the various units, the wafer transfer apparatuses and so on based on the instruction signal to execute treatment on the wafers W in each lot in the cassette.

Figure 5:
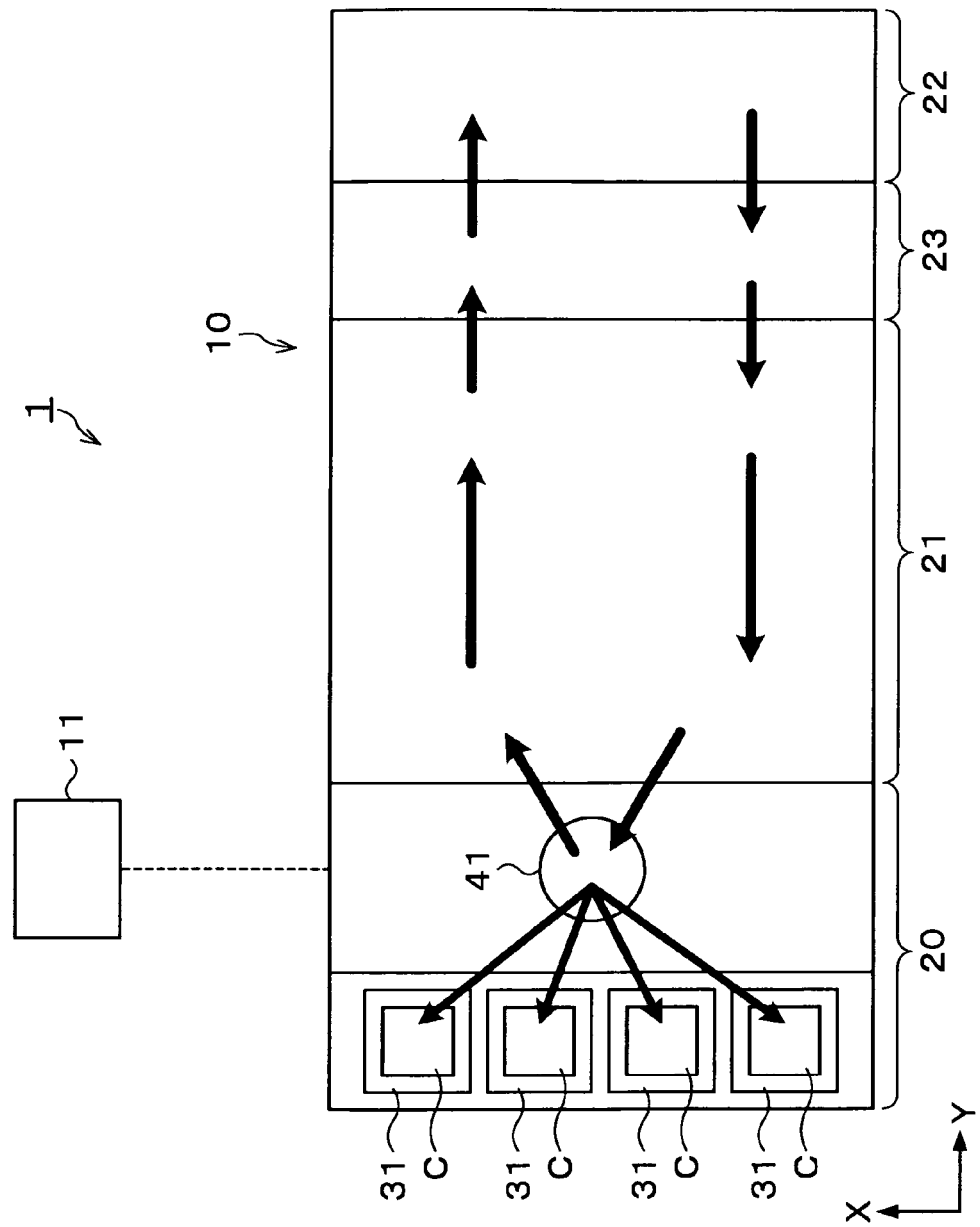
FIG. 5 is an explanatory view showing a wafer transfer path in a case where a cassette on a cassette mounting plate is selectable.

The control unit 11 can instruct, for example, the coating and developing treatment apparatus 10 to start the wafer treatment for a predetermined cassette mounted on the cassette mounting plate 31 of the coating and developing treatment apparatus 10. Further, for example, after the treatment on the wafers W in the predetermined cassette is started, the control unit 11 can arbitrarily select a cassette on the cassette mounting plate 31 to which the wafers W after completion of the treatment will be transferred, from among the plurality of cassettes on the cassette mounting plates 31. The control unit 11 can indicate the selected transfer destination cassette to the coating and developing treatment apparatus 10. Accordingly, in the substrate treatment system 1 according to this embodiment, the cassette to which the wafers W will be transferred is not determined at the start of treatment, and the wafers W are transferred to one of the cassettes on the cassette mounting plates 31 indicated by the control unit 11 as shown in FIG. 5. In other words, the cassette from which the wafers W are transferred out at the start of treatment and the cassette into which the wafers W are transferred at the completion of treatment can be made different, so that the relation between the cassette and the wafers therein is not fixed in transfer-in/out of cassettes in the coating and developing treatment apparatus 10.

The coating and developing treatment apparatus 10 has an alarm output unit 140 shown in FIG. 1 which gives an alarm, for example, when a predetermined condition is satisfied. The alarm output unit 140 has, for example, an alarm buzzer and an alarm lamp and can inform workers in the plant of the alarm. Further, the alarm output unit 140 can output an alarm signal to the control unit 11. The coating and developing treatment apparatus 10 can output an alarm, for example, if the transfer destination cassette has not been indicated when the number of remaining steps in the above-described wafer treatment reaches a predetermined set number, for example, two.

Next, a treatment method of wafers W performed using the substrate treatment system 1 structured as described above will be described.

Figure 6:
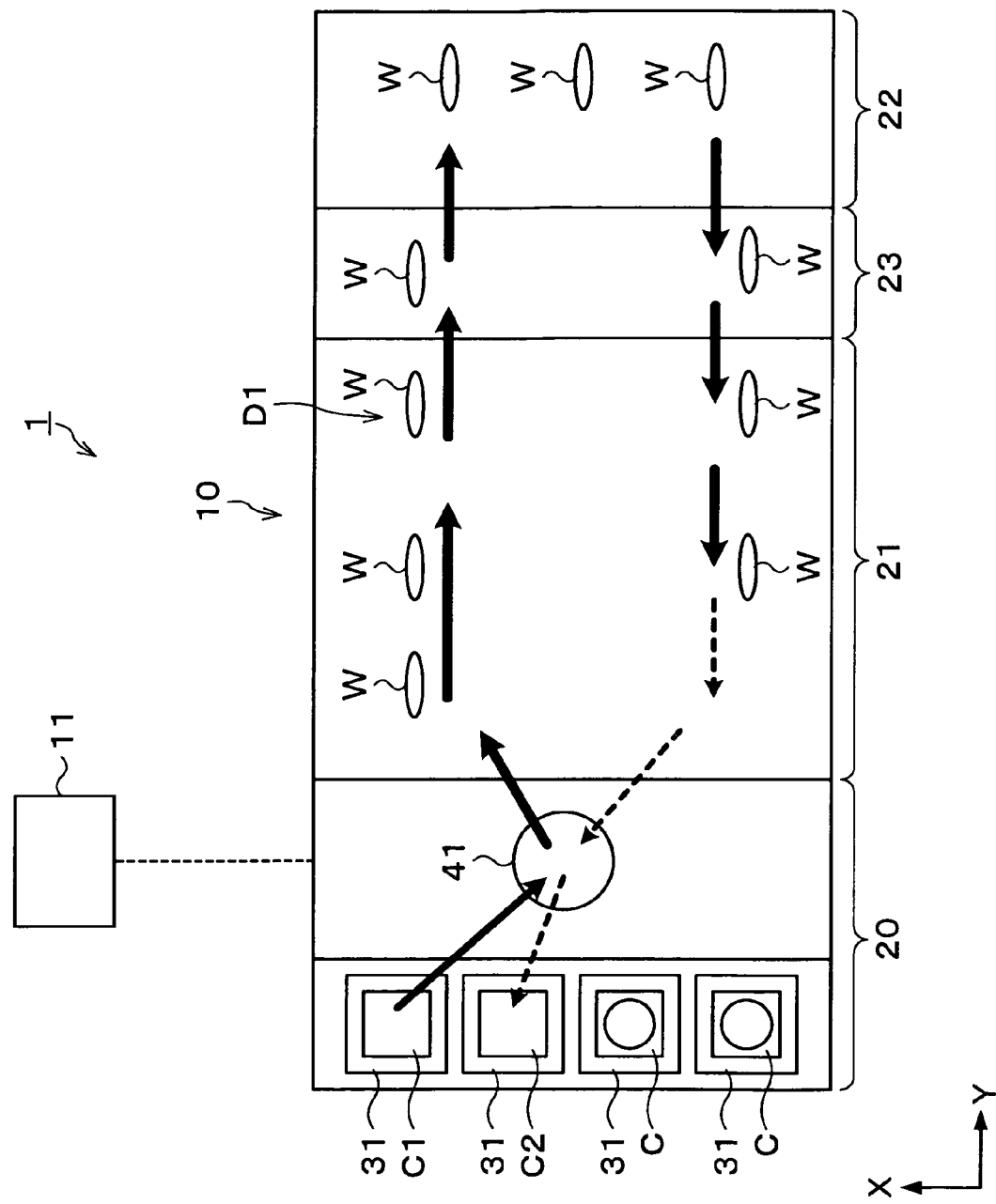

When, for example, a cassette C1 is mounted on the cassette mounting plate 31 in the cassette station 20 as shown in FIG. 6, treatment on a plurality of wafers W in a lot D1 in the cassette C1 is started by the instruction from the control unit 11. Thereafter, the wafers W are transferred to the treatment station 21 and the aligner 22 and subjected to treatment and processing in sequence as described above. During performance of the treatment and processing on the wafers W, the transfer destination cassette for the wafers W in the lot D1 is selected by the control unit 11 from among the cassettes mounted on the plurality of cassette mounting plates 31, and the control unit 11 indicates the selected, for example, cassette C2 to the coating and developing treatment apparatus 10. The selection of cassette is performed irrespective of whether the selected cassette is the original cassette or not, and a cassette is selected which is mounted on the cassette mounting plate 31 and has vacancy at the point in time when the first wafer W is returned to the cassette mounting plate 31.

Further, if the transfer destination cassette has not been indicated to the coating and developing treatment apparatus 10 from the control unit 11, for example, even at the time when only two steps of the treatment for the first wafer W in the lot D1 remain, for example, at a developing step S10, the alarm output unit 140 of the coating and developing treatment apparatus 10 gives an alarm. This alarm is given to the workers in the plant, for example, by the alarm buzzer and the alarm lamp. The alarm output unit 140 further outputs an alarm signal to the control unit 11. The control unit 11 indicates the transfer destination cassette for the lot D1, for example, the cassette C2, for example, based on the alarm signal. This indication is given, for example, prior to the indication of the transfer destination cassette for another lot. Thereafter, the wafers W in the lot D1 which are through the treatment are transferred in order to the selected cassette C2. Thus, all of the wafers W in the lot D1 are housed in the cassette C2 and transferred by the external cassette transfer apparatus B from the cassette mounting plate 31 to the outside of the coating and developing treatment apparatus 10.

According to the above embodiment, since the transfer destination cassette for wafers W is not determined at the start of treatment but can be arbitrarily selected from among the cassettes on the cassette mounting plates 31 after the start of treatment, the wafers W at the completion of treatment can be transferred to a cassette having vacancy at that time. Therefore, it is unnecessary to keep the same cassette waiting on the cassette mounting plate until the wafers are returned as in the prior art, so that a new cassette can be efficiently mounted on the cassette mounting plate even in small-lot treatment having small number of wafers in a lot, resulting in improved efficiency of treatment. Further, since the coating and developing treatment apparatus 10 gives an alarm if the transfer destination cassette has not been indicated to the coating and developing treatment apparatus 10 from the control unit 11 even at the time when only two steps of the treatment for the wafer W remain, for example, at a developing step S10, the workers in the plant and the control unit 11 can immediately deal with the situation and determine the transfer destination cassette for the wafers W. As a result, the wafer treatment can be smoothly performed in the wafer treatment method in which the transfer destination cassette is selected after the start of treatment.

The control unit 11 is configured to indicate, on a priority basis, the transfer destination cassette for the wafers W for which the transfer destination cassette has not been determined, based on the alarm from the coating and developing treatment apparatus 10, and therefore can surely determine the transfer destination before the wafers W are returned to the cassette mounting plate 31.

Next, a treatment method of the wafers W when trouble such as failure or the like occurs in the coating and developing treatment apparatus 10 during the treatment on the wafers W in the above-described substrate treatment system 1 will be described.

Figure 7:
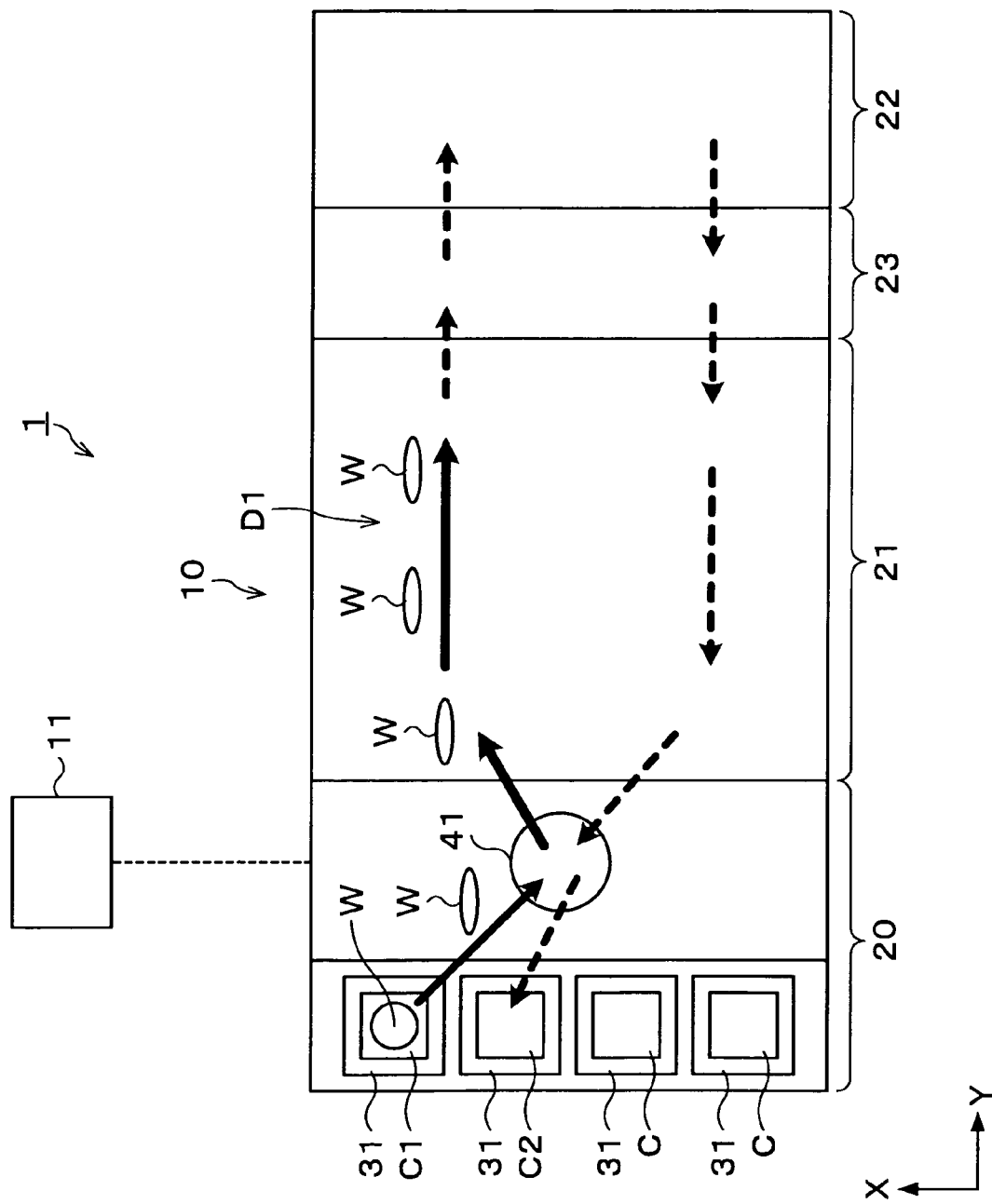
FIG. 7 is an explanatory view showing an example of collecting wafers when trouble occurs while the wafers in a predetermined lot are being transferred out of a cassette.
Figure 8:
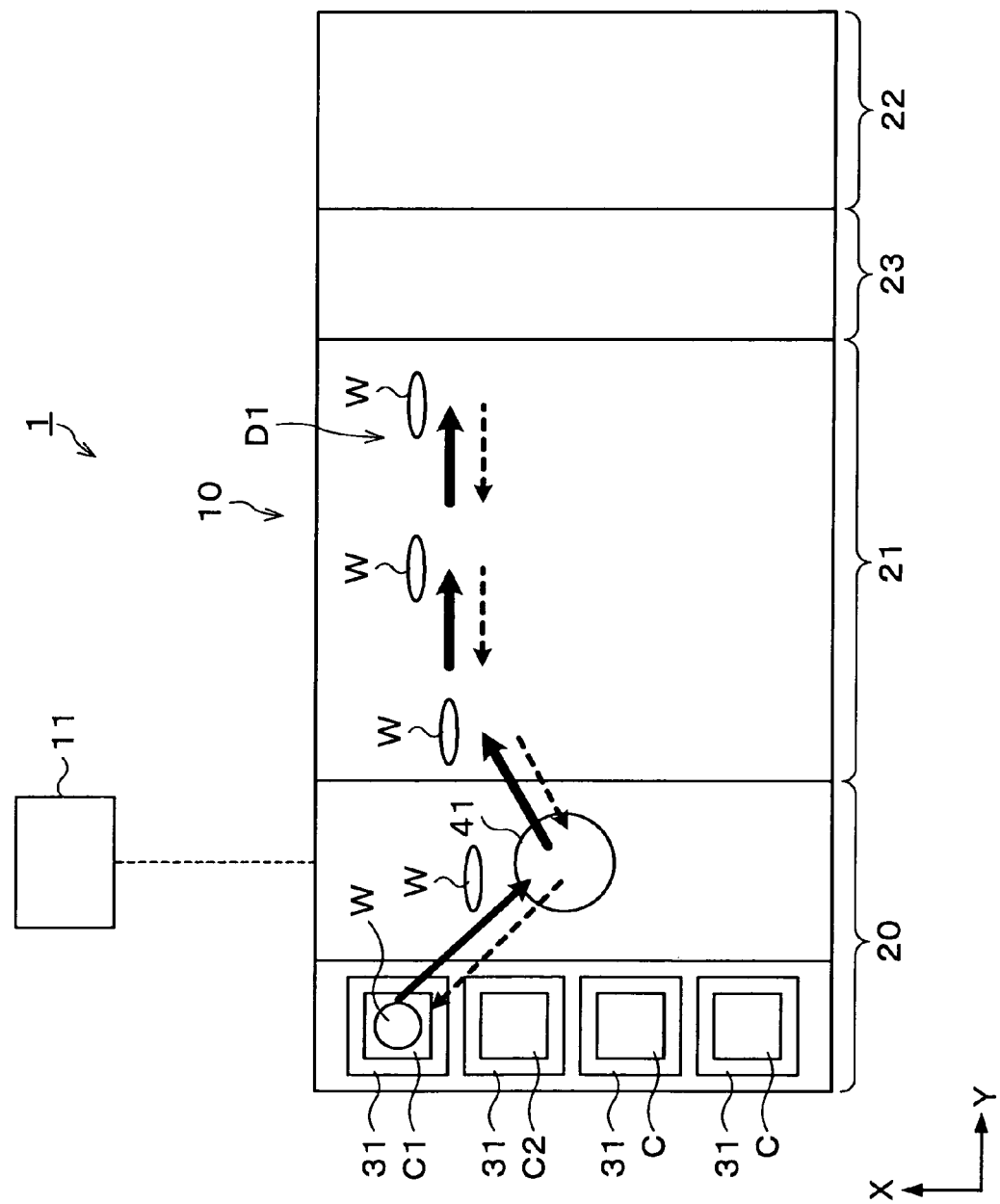
FIG. 8 is an explanatory view showing an example of collecting wafers when trouble occurs while the wafers in a predetermined lot are being transferred out of a cassette.

If trouble occurs in the coating and developing treatment apparatus 10, for example, while a plurality of wafers W in the lot D1 are being transferred out of the cassette C1 on the cassette mounting plate 31 as shown in FIG. 7, all of the wafers W in the lot D1 are transferred to the treatment station 21 after the trouble is solved, and transferred, for example, to the indicated cassette C2 on the cassette mounting plate 31 passing through the above-described transfer path at normal time. In this event, the wafers W in the lot D1 are transferred in order to the cassette C2 without being subjected to treatment and processing in the treatment station 21 and the aligner 22. The wafers W remaining in the cassette C1 at the occurrence of trouble in the lot D1 are transferred to the cassette C2 without being subjected to any treatment.

In this case, in the treatment method of the wafers W in which the transfer destination cassette for the wafers W is not determined at the start of treatment, even when trouble occurs in the coating and developing treatment apparatus 10 during the lot treatment, the wafers W in the same lot D1 are finally housed in the same cassette C2, so that the unity of the lot is maintained. As a result, it becomes easier to manage the subsequent treatment for the lot D1. Further, since the wafers W are transferred to the cassette C2 passing through the same path as that at normal time, for example, the transfer recipe for the wafers W at normal time can be used as it is, thereby simplifying the transfer control for the wafers W in wafer collection.

In another example, when trouble occurs in the coating and developing treatment apparatus 10, for example, while a plurality of wafers W in the lot D1 are being transferred out of the cassette C1 on the cassette mounting plate 31, the wafers W which have been already transferred out among the wafers W in the lot D1 may be returned to the original cassette C1 on the cassette mounting plate 31 after the trouble is solved.

In this case, the unity of the lot can be maintained as in the above-described case. Further, the cassette and the wafers W therein are returned to the state before the start of treatment at transfer-in of the cassette, thereby facilitating, for example, the management of the subsequent treatment for the lot D1.

Figure 9:
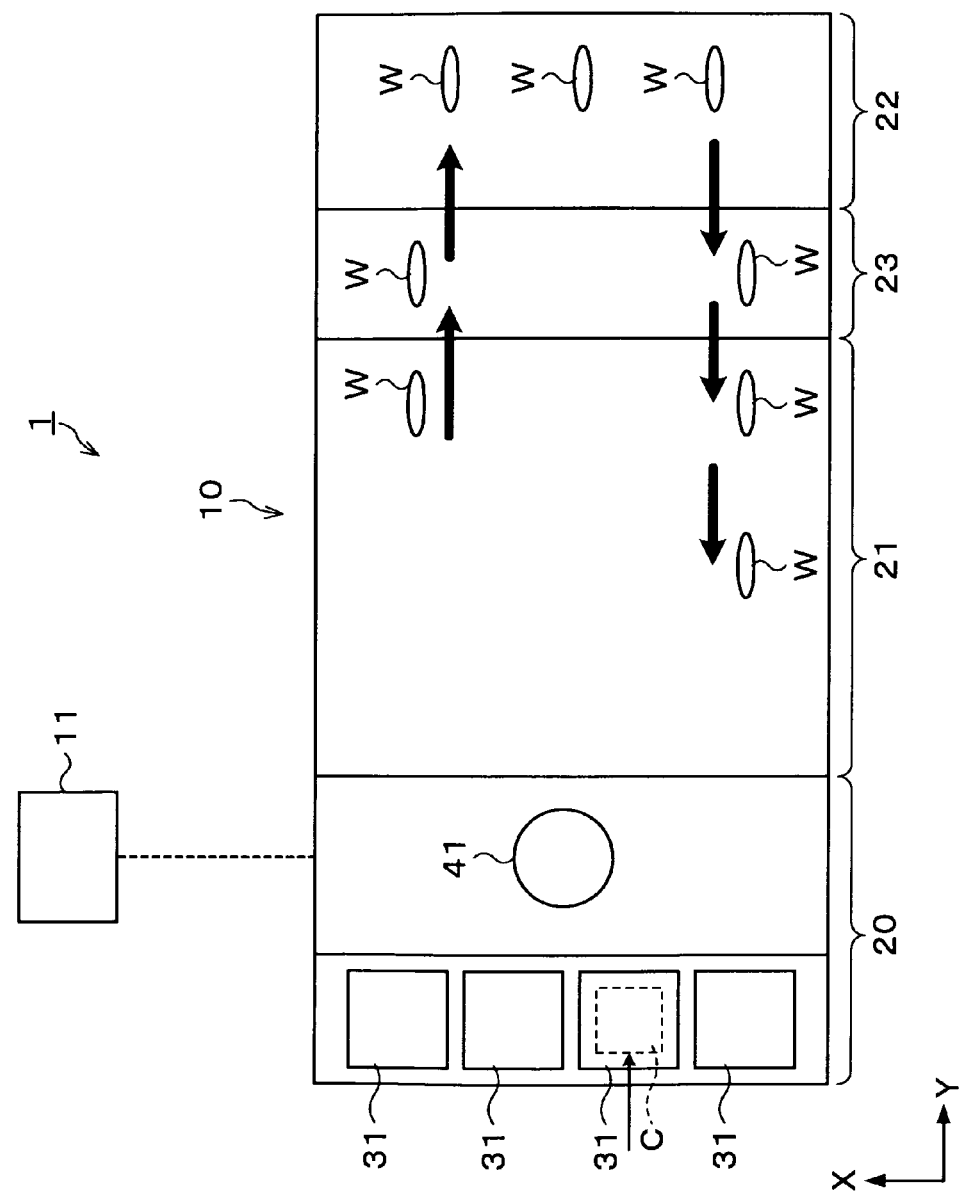
FIG. 9 is an explanatory view showing an example of transferring in wafers when trouble occurs while the wafers are being treated.

Further, if trouble occurs in the coating and developing treatment apparatus 10, for example, while wafers W are being treated in the treatment station 21 and when the transfer destination cassette for the wafers W is not mounted on the cassette mounting plate 31 at the time when the trouble is solved as shown in FIG. 9, the coating and developing treatment apparatus 10 may give an alarm. This alarm is outputted from, for example, the above-described alarm output unit 140.

Then, the alarm may be sent from the coating and developing treatment apparatus 10 to the control unit 11, and the control unit 11 may use the external cassette transfer apparatus B to transfer, into the cassette mounting plate 31, for example, a vacant cassette capable of housing, for example, all of the wafers W in the lot D1. With this configuration, the wafers W existing in the treatment station 21 at occurrence of trouble can be quickly and appropriately collected.

Figure 10:
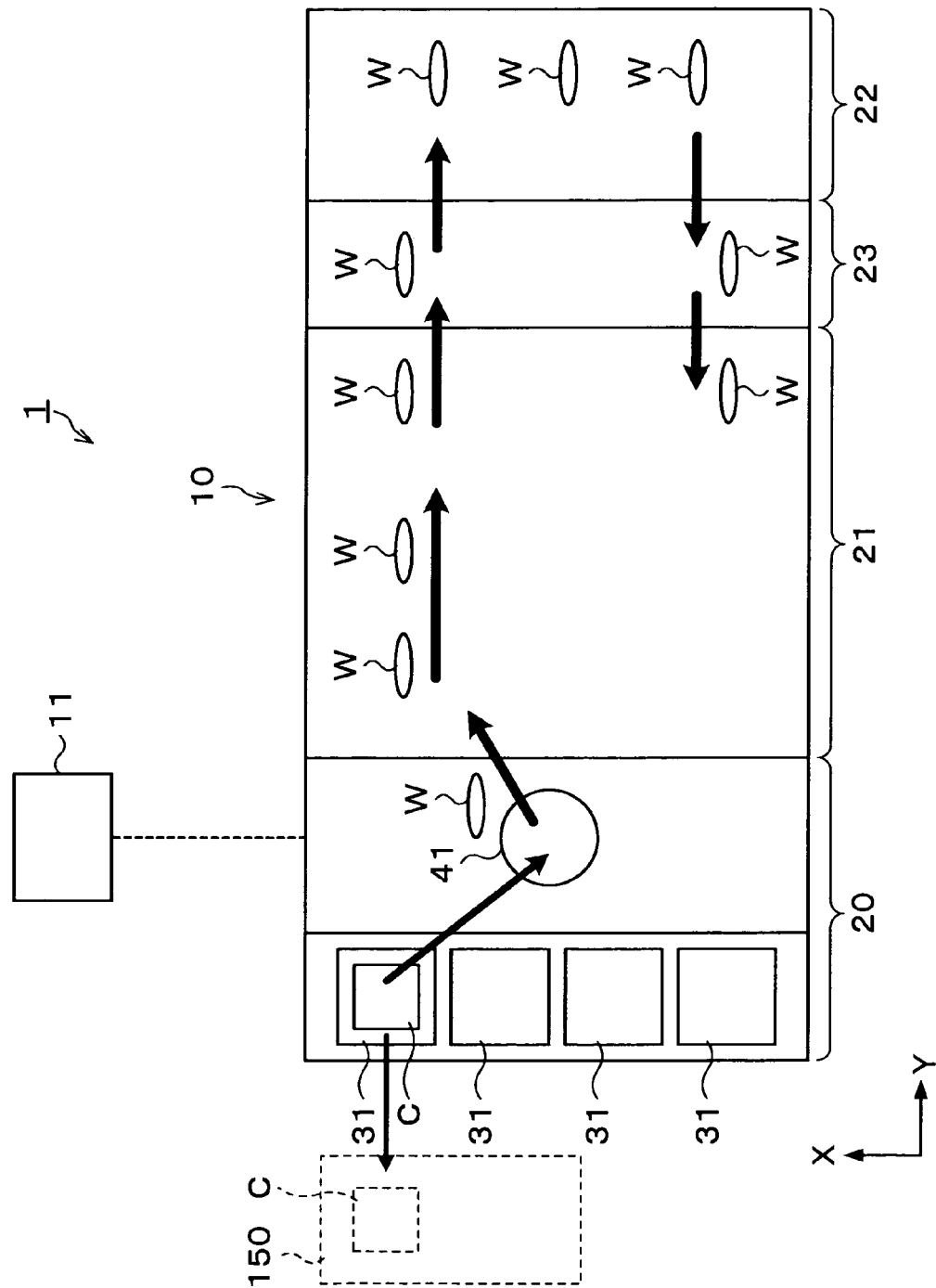
FIG. 10 is an explanatory view showing an example of temporarily transferring out a cassette which has become vacant to the outside of the coating and developing treatment apparatus.

Further, in the treatment method of the wafers W in the above embodiment, the cassette which has become vacant due to transfer of the wafers W from the cassette mounting plate 31 to the treatment station 21 may be temporarily transferred to the outside of the coating and developing treatment apparatus 10. In this case, the vacant cassette C is temporarily transferred by the external cassette transfer apparatus B to a cassette buffer 150 provided outside the coating and developing treatment apparatus 10 as shown in FIG. 10. With this configuration, the cassette mounting plate 31 becomes unoccupied and therefore a new cassette can be transferred into the coating and developing treatment apparatus 10, leading to an improved treatment efficiency for the wafers W even in small-lot treatment.

Further, in this case, if an estimated time T1 from the time when a cassette becomes vacant till when wafers W through treatment are started to be transferred into the cassette is shorter than a predetermined set time T2, the transfer of the vacant cassette to the outside may be stopped. For example, when a cassette becomes vacant or before a cassette becomes vacant, the estimated time T1 until wafers W are started to be transferred into the cassette next time is compared to the set time T2. Then, when the estimated time T1 is longer than the set time T2, the vacant cassette is temporarily transferred from the cassette mounting plate 31 to the outside of the coating and developing treatment apparatus 10. On the other hand, when the estimated time T1 is shorter than the set time T2, the transfer of the vacant cassette to the outside is stopped.

In this case, a situation that the vacant cassette is transferred to the outside of the apparatus even though there remains a short time and the cassette is late for housing the wafers W is avoided, so that the treatment on the wafers W can be smoothly performed.

In the above embodiment, the indication of the transfer destination cassette for the wafers W by the control unit 11 may be performed when the remaining treatment steps of the wafer treatment in the treatment station 21 reaches a predetermined set number. The set number is determined so that the transfer destination cassette for the wafers W is indicated before the step at which an alarm is given for the case where the transfer destination cassette has not been indicated in the above embodiment. In this embodiment, the set number of the remaining steps is, for example, five, and the control unit 11 indicates the transfer destination cassette for the wafers W when the edge exposure step S7 shown in FIG. 4 is performed on the first wafer W in the lot D1. In this case, the transfer destination cassette for the wafers W can be surely designated before the alarm is given. Note that when the transfer destination cassette is designated at a predetermined step as described above, the function of giving an alarm may be omitted or may be provided. In the case where the setting was made to give an alarm, an alarm is given, for example, at the developing step S10 even when the transfer destination cassette has not been designated at the edge exposure step S7, and a transfer destination cassette will be designated based on the alarm.

Figure 11:
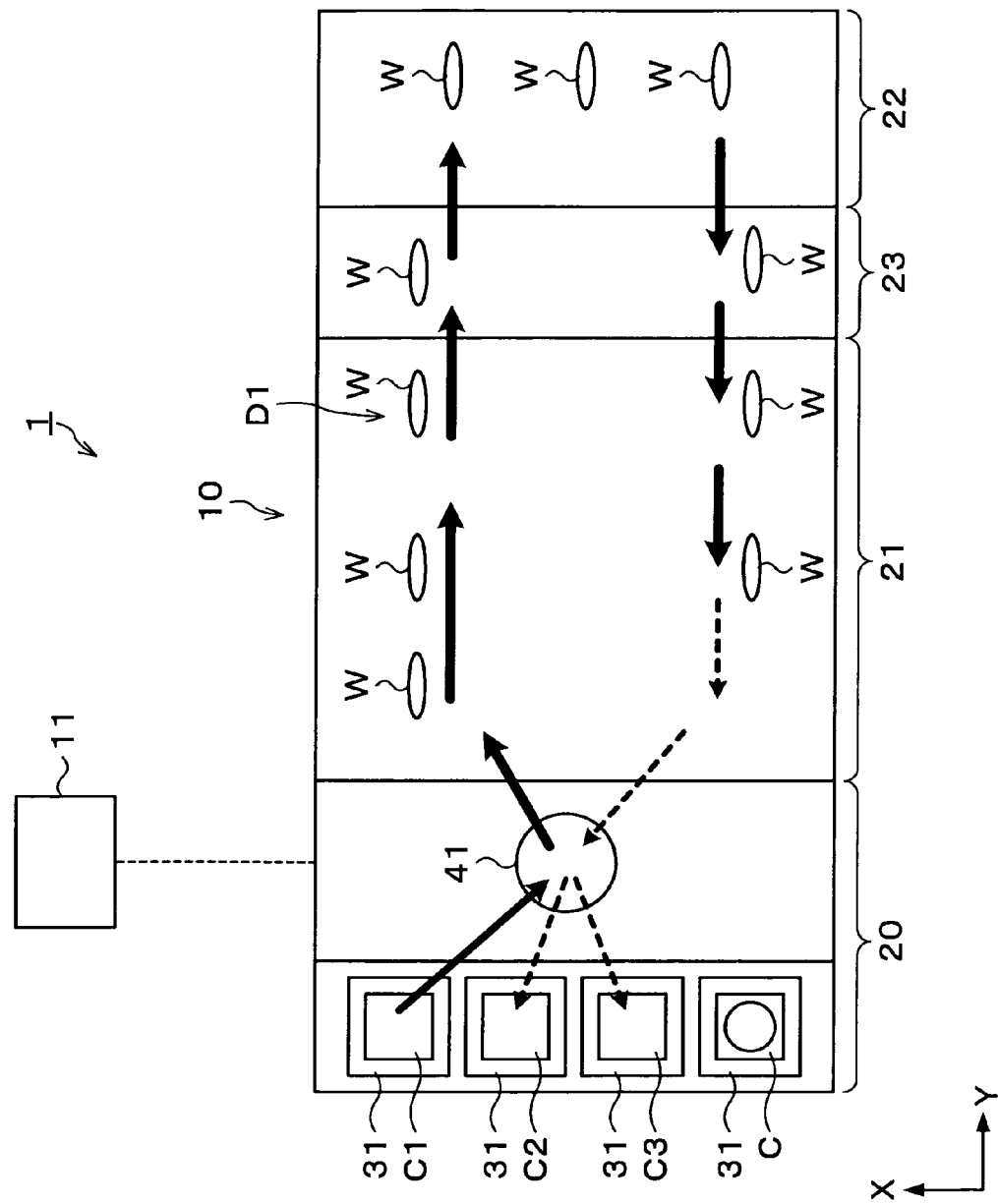
FIG. 11 is an explanatory view of an example when a plurality of wafers in one lot are transferred to different cassettes.

Though the wafers W in the lot D1 in the cassette C1 are transferred to the cassette C2 in the above embodiment, the wafers W may be separately transferred to a plurality of cassettes, for example, two cassettes C2 and cassette C3 as shown in FIG. 11. For example, after the wafer treatment is completed in the substrate treatment system 1, the wafers W in the lot D1 are sometimes divided by a not-shown wafer sorter to sets of a predetermined number of wafers W and subjected to subsequent treatment step. According to this embodiment, the sets of a predetermined number of wafers W can be divided to the cassettes C2 and C3 in the substrate treatment system 1, so that the sorting of the wafers W by the wafer sorter can be omitted. Accordingly, the throughput of the whole wafer treatment can be improved.

Further, in the embodiment, one wafer W of the wafers W in the lot D1 may be extracted transferred to the cassette C2, and the remaining wafers W may be transferred to the cassette C3. In this case, the wafer W extracted to the cassette C2 can be inspected.

Figure 12:
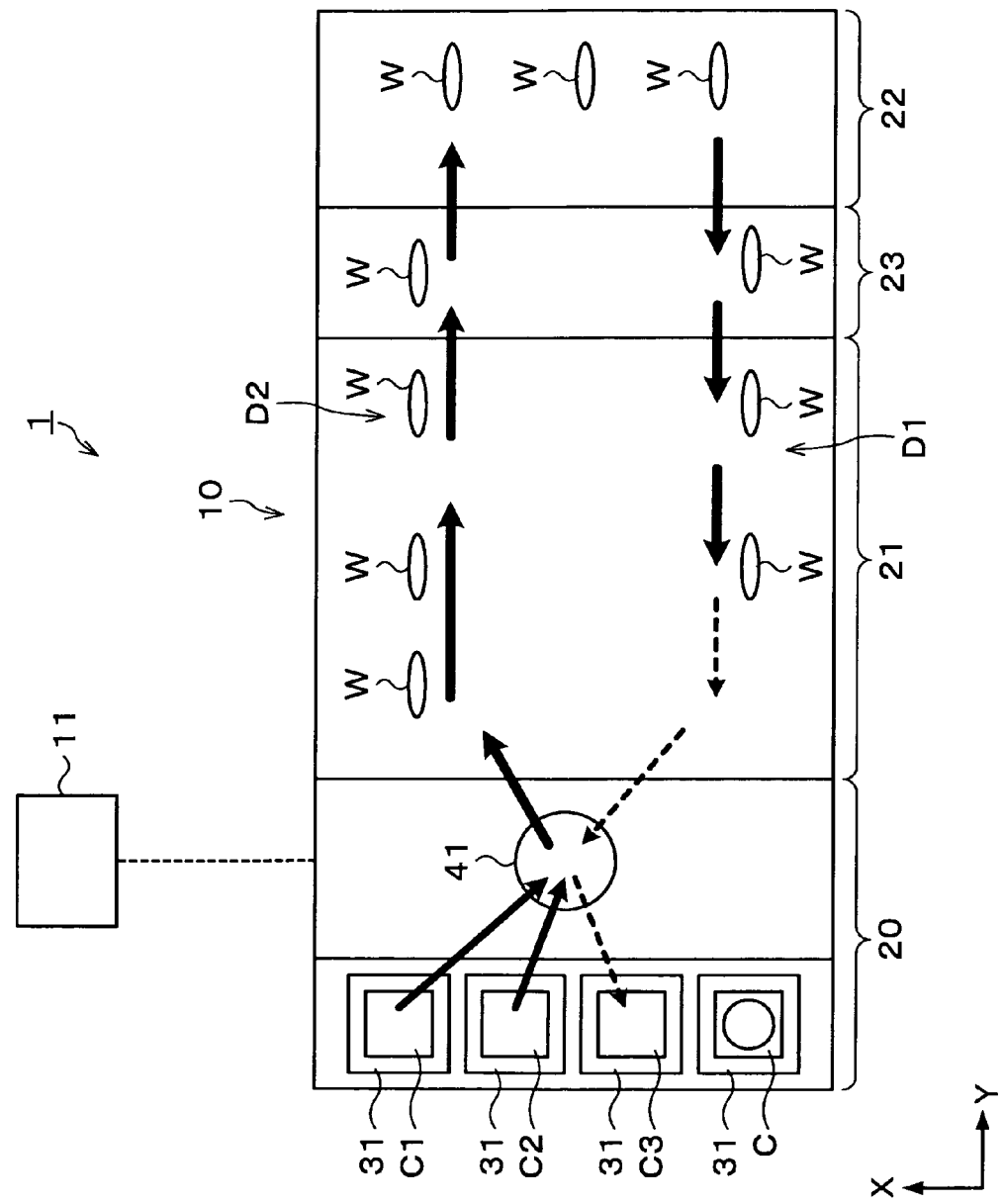
FIG. 12 is an explanatory view showing an example when wafers in a plurality of lots are transferred to one cassette.

Though the wafers W in the lot D1 in the cassette C1 are transferred to the cassette C2 in the above embodiment, wafers W in a plurality of cassettes, for example, the wafers W in the lot D1 in the cassette C1 and wafers W in a lot D2 in the cassette C2 may be transferred to one cassette C3 as shown in FIG. 12. For example, after the wafer treatment in the substrate treatment system 1 is completed, the wafers W in the lot D1 and the wafers W in the lot D2 are sometimes joined by a not-shown wafer sorter and subjected to the subsequent treatment step. According to this embodiment, the wafers W in the plurality of cassettes C1 and C2 can be transferred to the one cassette C3 in the substrate treatment system 1, so that the sorting of the wafers W by the wafer sorter can be omitted.

Incidentally, in the above embodiment, information of the transfer destination cassette (hereinafter, referred to as "transfer destination cassette information") is transmitted from the control unit 11 to the coating and developing treatment apparatus 10 to indicate a cassette. At the time of indication or after the indication, the indicated cassette is mounted on the cassette mounting plate 31, whereby the transfer destination cassette is determined. Note that the indication of the cassette is performed, for example, when an alarm is given in a predetermined treatment (the developing step S10 in FIG. 4) or performed in a predetermined treatment (the edge exposure step S7 in FIG. 4) of the above embodiment.

Figure 13:
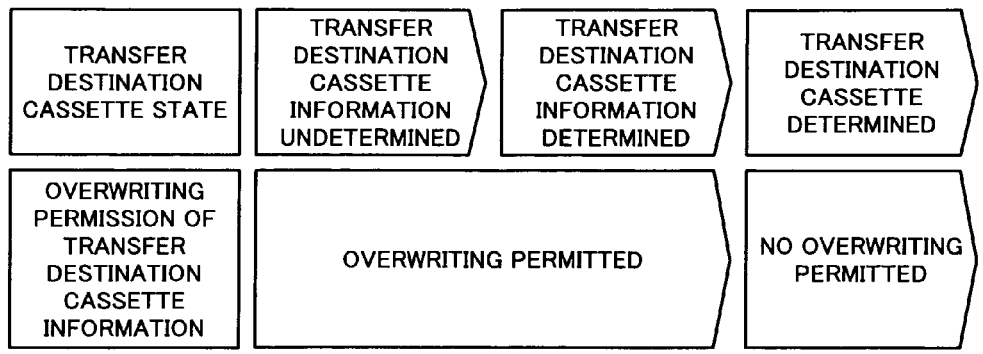
FIG. 13 is an explanatory view showing the possibility of overwriting transfer destination cassette information.

Though the cassette mounted on the cassette mounting plate 31 is indicated as the transfer destination for the wafers W in the above embodiment, a cassette not mounted on the cassette mounting plate 31 may be indicated at the indication. In this case, it is adoptable that, for example, the transfer destination cassette information can be overwritten until the transfer destination cassette is determined, even after the transfer destination cassette information is determined as shown in FIG. 13. This makes it possible to change the transfer destination cassette after the transfer destination cassette information is determined. Note that once the transfer destination cassette is determined, the transfer destination cassette information cannot be overwritten in this embodiment.

For example, when the cassette C1 that is not mounted on the cassette mounting plate 31 is indicated as the transfer destination for the wafers W in the lot D1, other cassettes C2 to C5 have been already mounted on all of the cassette mounting plates 31 in some case. In this case, the use of the method in this embodiment makes it possible to indicate one of the cassettes C2 to C5 mounted on the cassette mounting plates 31 as the transfer destination for the wafers W in the lot D1, in place of the cassette C1. This eliminates the necessity to keep the wafers W in the lot D1 waiting, resulting in that the wafers W in the lot D1 can be efficiently transferred to the cassette. Further, also when the cassette C1 cannot be mounted on the cassette mounting plate 31 due to occurrence of trouble after the cassette C1 has been indicated as the transfer destination for the wafers W in the lot D1, one of the other cassettes C2 to C5 on the cassette mounting plates 31 can be designated.

Figure 14:
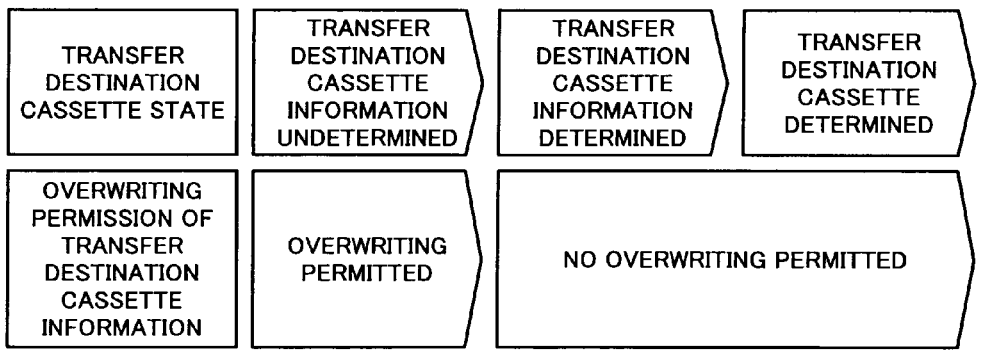
FIG. 14 is an explanatory view showing the possibility of overwriting transfer destination cassette information.

Note that, in the above embodiment, setting may be made such that once the transfer destination cassette information is determined, the transfer destination cassette information cannot be overwritten as shown in FIG. 14.

Figure 15:
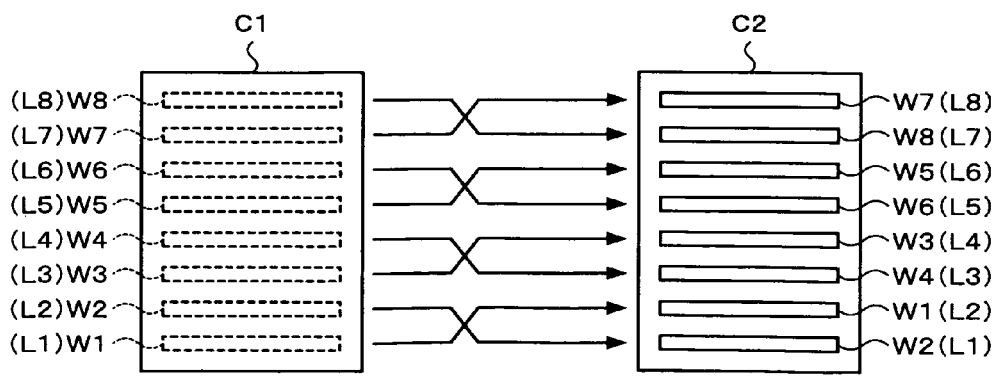
FIG. 15 is an explanatory view showing transfer destination slots for wafers when slots in a cassette are selectable.
Figure 16:
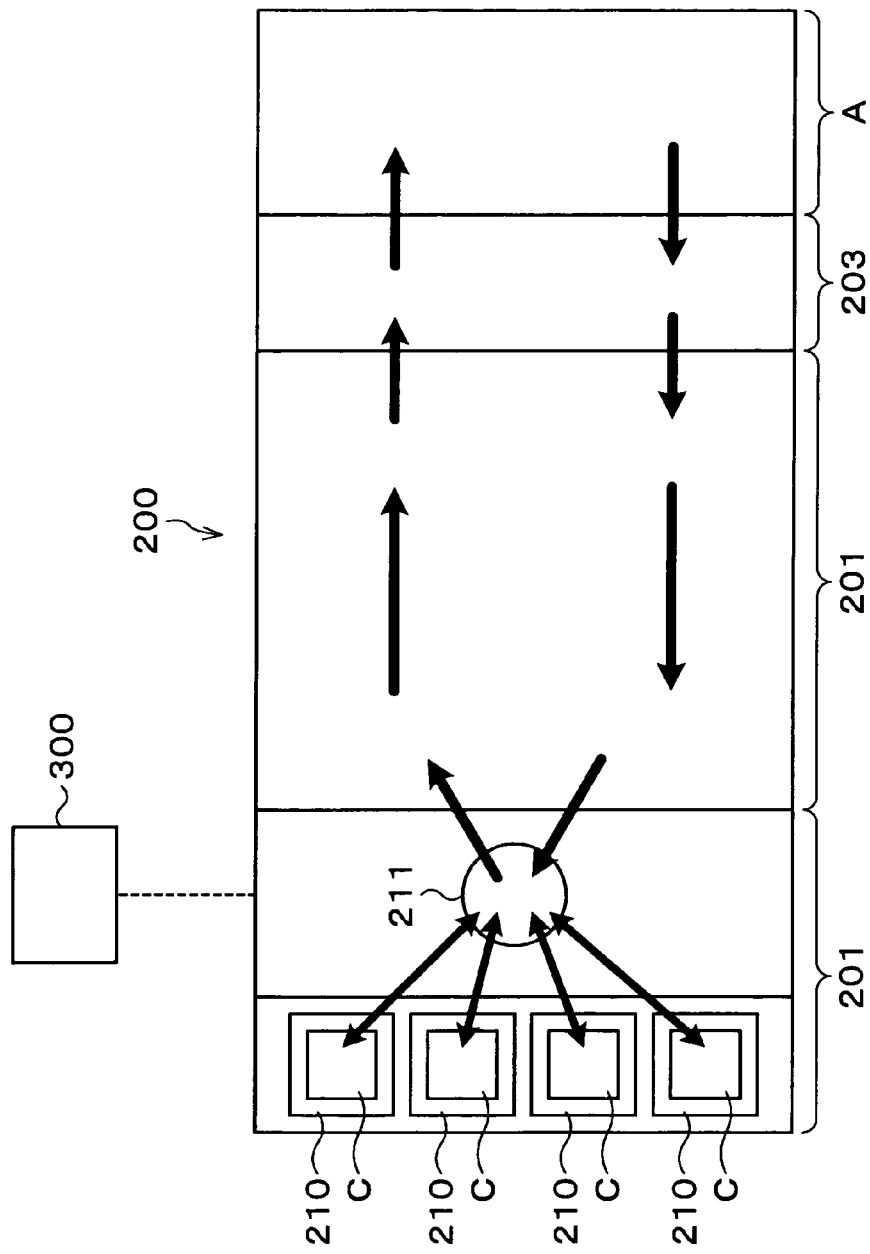
FIG. 16 is an explanatory showing a wafer transfer path when a cassette at transfer-in and at transfer-out is fixed.

In the cassette C in the above embodiment, slots L1 to L8 as a plurality of substrate housing slots are provided which house the wafers W, for example, as shown in FIG. 15. Further, W1 to W8 as wafer IDs are given, for example, to the wafers W in the cassette C1. Further, it is adoptable that when the cassette C2 that is the transfer destination for the wafers W1 to W8 is indicated by the control unit 11 while the wafers W1 to W8 are being transferred out of the cassette C1 and subjected to wafer treatment in the coating and developing treatment apparatus 10, the transfer destination slots L1 to L8 for the wafers W1 to W8 is indicated at the same time. In this case, the slots L1 to L8 of the cassette C2 can be arbitrarily selected as the transfer destination slots for the wafers W1 to W8. In other words, the slots L1 to L8 of the destination source cassette C1 in which the wafers W1 to W8 are housed and the slots L1 to L8 of the transfer destination cassette C2 can be made different.

Preferred embodiments of the present invention have been described above with reference to the accompanying drawings, and the present invention is not limited to the embodiments. It should be understood that various changes and modifications within the scope of the spirit as set forth in claims are readily apparent to those skilled in the art, and those should also be covered by the technical scope of the present invention.

Though the substrate treatment apparatus in the substrate treatment system described in the above embodiments is a coating and developing treatment apparatus which performs photolithography treatment, but may be one performing other treatment. Further, the present invention is also applicable to a treatment system for substrates other than the semiconductor wafer, such as an FPD (Flat Panel Display), a mask reticle for a photomask, and the like.

INDUSTRIAL APPLICABILITY

The present invention is useful for a substrate treatment system performing small-lot treatment.

What is claimed:

1. A method of treating plural substrates using a substrate treatment apparatus that operates based on instructions received from a control unit, the method comprising:
   initiating the method of treating plural substrates using the substrate treatment apparatus;
   transferring each substrate of a plurality of substrates contained in a plurality of cassettes arranged on a plurality of mounting parts into a substrate treatment part, which contains a plurality of substrate treatment units for treating each substrate,
   transferring each substrate to and between each of the substrate treatment units;
   after treatment begins on each substrate, the control unit arbitrarily selecting a cassette from the plurality of cassettes and designating the selected cassette as a transfer-destination cassette to the substrate treatment apparatus for transfer of a designated substrate after completion of treatment for each substrate, the designating of the transfer-destination cassette occurring when a number of remaining treatment steps for the substrate reaches a predetermined set number;
   outputting an alarm signal from the substrate treatment apparatus to the control unit, if the designating of the transfer-destination cassette for each substrate has not been completed when the number of remaining treatment steps for each substrate reaches another number smaller than the predetermined set number; and based on the alarm signal and on a priority basis, the control unit designating the transfer-destination cassette for any substrates of the plurality of cassettes not already having a transfer-destination cassette; and
   after the completion of treatment, transferring each substrate into the plurality of cassettes mounted on the plurality of mounting parts and out of the substrate treatment part which includes transferring the designated substrates from the substrate treatment part respectively into the transfer-destination cassettes mounted on the plurality of mounting parts.

2. The method of treating plural substrates as set forth in claim 1, wherein if trouble occurs in the substrate treatment apparatus while transferring substrates in one lot of the plurality of substrates from the plurality of cassettes, all substrates in the one lot are transferred to the substrate treatment part, passed through a transfer path at normal time without being subjected to treatment, and then transferred to the transfer-destination cassette mounted on one of the plurality of cassette mounting parts.

3. The method of treating plural substrates as set forth in claim 1, wherein if trouble occurs in the substrate treatment apparatus while substrates in one lot are being transferred out of the plurality of cassettes, a transferred substrate which has been already transferred out among the substrates in the one lot is returned to an original cassette on the plurality of cassette mounting parts.

4. The method of treating plural substrates as set forth in claim 1, wherein another alarm is output from the substrate treatment apparatus if trouble occurs in the substrate treatment apparatus under conditions as follows:
   after the designating step,
   while the designated substrate is being treated in the substrate treatment part, and
   when the transfer-destination cassette for the designated substrate is not mounted on the cassette mounting part at a time when the trouble is solved.

5. The method of treating plural substrates as set forth in claim 4, wherein
   the another alarm from the substrate treatment apparatus is sent to the control unit; and
   the control unit transfers a cassette capable of housing all substrates in a lot to which the designated substrate belongs from the outside of the substrate treatment apparatus onto the cassette mounting part.

6. The method of treating plural substrates as set forth in claim 1, further comprising the step of:
   temporarily transferring a vacant cassette to the outside of the substrate treatment apparatus, the vacant cassette becoming vacant by transferring all substrates therefrom to the substrate treatment part, wherein
   an estimated time begins when the vacant cassette becomes vacant and ends when substrates designated for the vacant cassette begin to transfer into the vacant cassette, and
   if the estimated time is shorter than a predetermined set time, the transfer of the vacant cassette to the outside is stopped.

7. The method of treating plural substrates as set forth in claim 1, wherein the designating step includes designating that substrates in one lot are transferred to different transfer-destination cassettes.

8. The method of treating plural substrates as set forth in claim 7, wherein the transfer-destination cassettes include one cassette on the cassette mounting parts to which one substrate of the substrates in the one lot is transferred and another cassette to which remaining substrates are transferred.

9. The method of treating plural substrates as set forth in claim 1, wherein the designating step includes designating one cassette on the cassette mounting parts as the transfer-destination cassette to which substrates in a plurality of lots are transferred.

10. The method of treating plural substrates as set forth in claim 1, wherein if the transfer-destination cassette is not mounted on the cassette mounting parts; the control unit designates another cassette different from the transfer-destination cassette, as the transfer-destination cassette for the substrate.

11. The method of treating plural substrates as set forth in claim 1, wherein
   the transfer-destination cassette has a plurality of substrate housing slots, and the designating step includes designating a substrate housing slot of the transfer-destination cassette on the cassette mounting parts for each substrate.

12. A substrate treatment system including a substrate treatment apparatus that operates based on instructions received from a control unit to perform substrate treatment, the substrate treatment apparatus comprising:
   a plurality of cassette mounting parts configured to mount cassettes thereon and transfer the cassettes from outside the substrate treatment apparatus into the substrate treatment apparatus and from inside the substrate treatment apparatus to outside the substrate treatment apparatus, and each of the cassettes housing a plurality of substrates;
   a substrate treatment part including a plurality of substrate treatment units for treating the substrates, each substrate treatment unit being configured to perform a treatment step on the substrates;
   a substrate transfer part configured to transfer each substrate from the plurality of cassettes mounted on the plurality of mounting parts into the substrate treatment part, through and between the plurality of substrate treatment units of the substrate treatment part, and out of the substrate treatment part and onto the plurality of cassettes mounted on the plurality of mounting parts; and
   the control unit being configured to:
      initiate the substrate treatment using the substrate treatment apparatus and performing substrate treatment;
      instruct the transfer part to transfer each substrate of the plurality of substrates contained in the plurality of cassettes arranged on the plurality mounting parts into the substrate treatment part;
      instruct the transfer part to transfer each substrate between the plurality of substrate treatment units;
      select arbitrarily a cassette from the plurality of cassettes and to designate to the substrate treatment apparatus that the selected cassette is a transfer-destination cassette for transfer of a designated substrate of the plurality of substrates after completion of treatment for each substrate, the selecting and designating of the transfer-destination cassette occurring after treatment begins on each substrate; and
      instruct the transfer part to transfer each substrate into the plurality of cassettes on the plurality of mounting parts and out of the substrate treatment part, the transfer including transferring the designated substrates from the treatment part respectively into the transfer-destination cassettes mounted on the plurality of mounting parts,
   wherein the substrate treatment apparatus is configured to output an alarm signal to the control unit if the transfer-destination cassette of the designated substrate at the completion of treatment has not been designated when a number of remaining treatment steps for the substrate reaches a predetermined set number, and the designating of the transfer-destination cassette occurs when the number of remaining treatment steps for the substrate reaches another number larger than the predetermined set number, and
   wherein based on the alarm from the substrate treatment apparatus and on a priority basis, the control unit is further configured to designate the transfer-destination cassette for any substrates of the plurality of cassettes not already having a transfer-destination cassette.

13. The substrate treatment system as set forth in claim 12, wherein if trouble occurs in the substrate treatment apparatus while transferring substrates in one lot of the plurality of substrates from the plurality of cassettes, all substrates in the one lot are transferred to the substrate treatment part, passed through a transfer path at normal time without being subjected to treatment, and then transferred to the transfer-destination cassette mounted on one of the plurality of cassette mounting parts.

14. The substrate treatment system as set forth in claim 12, wherein if trouble occurs in the substrate treatment apparatus while substrates in one lot are being transferred out of the plurality of cassettes, a transferred substrate which has been already transferred out among the substrates in the one lot is returned to an original cassette on the plurality of cassette mounting parts.

15. The substrate treatment system as set forth in claim 12, wherein another alarm is output from the substrate treatment apparatus if trouble occurs in the substrate treatment apparatus under conditions as follows:
   after the control unit designates the transfer-destination cassette,
   while the designated substrate is being treated in the substrate treatment part, and
   when the transfer-destination cassette for the designated substrate is not mounted on the cassette mounting part at a time when the trouble is solved.

16. The substrate treatment system as set forth in claim 15, wherein
   the another alarm from the substrate treatment apparatus is sent to the control unit; and
   the control unit transfers a cassette capable of housing all substrates in a lot to which the designated substrate belongs from the outside of the substrate treatment apparatus onto the cassette mounting part.

17. The substrate treatment system as set forth in claim 12, wherein the controller is further configured to transfer temporarily a vacant cassette to the outside of the substrate treatment apparatus, the vacant cassette becoming vacant by transferring all substrates therefrom to the substrate treatment part, and
wherein
   an estimated time begins when the vacant cassette becomes vacant and ends when substrates designated for the vacant cassette begin to transfer into the vacant cassette, and
   if the estimated time is shorter than a predetermined set time, the transfer of the vacant cassette to the outside is stopped.

18. The substrate treatment system as set forth in claim 12, wherein the designating by the control unit includes designating that substrates in one lot are transferred to different transfer-destination cassettes.

19. The substrate treatment system as set forth in claim 18, wherein the transfer-destination cassettes include one cassette on the cassette mounting parts to which one substrate of the substrates in the one lot is transferred and another cassette to which remaining substrates are transferred.

20. The substrate treatment system as set forth in claim 12, wherein the designating by the control unit includes designating one cassette on the cassette mounting parts as the transfer-destination cassette to which substrates in a plurality of lots are transferred.

21. The substrate treatment system as set forth in claim 12, wherein if the transfer-destination cassette is not mounted on the cassette mounting parts; the control unit designates another cassette different from the transfer-destination cassette, as the transfer-destination cassette for the substrate.

22. The substrate treatment system as set forth in claim 12, wherein the transfer-destination cassette has a plurality of substrate housing slots, and the designating by the control unit includes designating a substrate housing slot of the transfer-destination cassette on the cassette mounting parts for each substrate.

* * * * *